(12) United States Patent
Tanaka (10) Patent No.: US 8,610,186 B2
(45) Date of Patent: Dec. 17, 2013

(54) SOLID-STATE IMAGING DEVICE WHICH CAN EXPAND DYNAMIC RANGE

(75) Inventor: Nagataka Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 393 days.

(21) Appl. No.: 12/883,564

(22) Filed: Sep. 16, 2010

(65) Prior Publication Data

US 2011/0140182 A1 Jun. 16, 2011

(30) Foreign Application Priority Data

Dec. 15, 2009 (JP) ................................ 2009-284332

(51) Int. Cl.
*H01L 31/062* (2012.01)

(52) U.S. Cl.
USPC ................... 257/294; 257/292; 257/E27.132; 257/E27.134

(58) Field of Classification Search
USPC .................. 257/291–294, E27.132–E23.134
See application file for complete search history.

(56) References Cited

U.S. PATENT DOCUMENTS

| | | | | |
|---|---|---|---|---|
| 5,955,753 | A | * | 9/1999 | Takahashi ..................... 257/292 |
| 6,831,692 | B1 | * | 12/2004 | Oda ............................. 348/315 |
| 2006/0170802 | A1 | * | 8/2006 | Misawa ........................ 348/297 |
| 2006/0181626 | A1 | | 8/2006 | Lee |
| 2009/0230394 | A1 | | 9/2009 | Nagaraja et al. |

FOREIGN PATENT DOCUMENTS

| | | |
|---|---|---|
| JP | 2000-125209 | 4/2000 |
| JP | 2000-125310 | 4/2000 |
| JP | 2005-286565 | 10/2005 |
| JP | 2007-110496 | 4/2007 |
| JP | 2008-99073 | 4/2008 |
| JP | 2008-218670 | 9/2008 |
| JP | 2009-268078 | 11/2009 |

OTHER PUBLICATIONS

Yoshitaka Egawa, et al., "A 1/2.5 inch 5.2Mpixel, 96dB Dynamic Range CMOS Image Sensor with Fixed Pattern Noise Free, Double Exposure Time Read-Out Operation" 2006, IEEE International Solid-State Conference, Digest of Technical Papers, 2006, pp. 135-138.
U.S. Appl. No. 12/828,718, filed Jul. 1, 2010, Nagataka Tanaka et al.
Office Action issued Feb. 26, 2013 in Japanese Application No. 2009-284332 (With English Translation).
Office Action issued Apr. 15, 2013 in Taiwanese Patent Application No. 099130205.

* cited by examiner

*Primary Examiner* — Matthew E Warren
(74) *Attorney, Agent, or Firm* — Oblon, Spivak, McClelland, Maier & Neustadt, L.L.P.

(57) ABSTRACT

According to one embodiment, a solid-state imaging device includes an area and color filters. The area includes pixels. Each of the pixels includes a first photodiode, a first read transistor, a second photodiode, a second read transistor, a floating diffusion, a reset transistor, and an amplifying transistor. The first photodiode performs photoelectric conversion. The first read transistor reads a signal charge. The second photodiode has a photosensitivity lower than the first photodiode. The second read transistor reads a signal charge. The floating diffusion stores the signal charges. The reset transistor resets a potential of the floating diffusion. The amplifying transistor amplifies the potential of the floating diffusion. The color filters include a first and a second filters. The relationship QSAT1 > QSAT2 is satisfied. When a saturation level of the first filter is denoted by QSAT1 and a saturation level of the second filter is denoted by QSAT2.

9 Claims, 9 Drawing Sheets

SOLID-STATE IMAGING DEVICE WHICH CAN EXPAND DYNAMIC RANGE

CROSS-REFERENCE TO RELATED APPLICATIONS

This application is based upon and claims the benefit of priority from Japanese Patent Application No. 2009-284332, filed Dec. 15, 2009; the entire contents of which are incorporated herein by reference.

FIELD

Embodiments described herein related generally to a solid-state imaging device equipped with a circuit of unit pixels used for a CMOS image sensor.

BACKGROUND

A plurality of unit pixels (unit cells) are arranged in rows and columns in an imaging area of a CMOS image sensor. For example, Jpn. Pat. Appln. KOKAI Pub. Nos. 2000-125209 and 2005-286565 disclose a CMOS image sensor, in which each unit pixel is provided with a high-sensitivity photodiode and a low-sensitivity photodiode and thereby a signal electric charge dealing quantity (dynamic range) of pixels is enlarged.

The dynamic range of pixels is determined by a saturation level of photodiodes of pixels of a specific color, and pixels of colors other than the specific color cannot be used to the saturation level. For example, in RGB sensors provided with color filters of an RGB Bayer arrangement which is generally used, sensitivity of G (green) pixels is the highest, and the G pixels reach the saturation level first when light is made incident. At this point in time, B (blue) and R (red) pixels other than G have not reached the saturation level. In this case, the dynamic range of the whole pixels is restricted by the dynamic range of the G pixels.

As described above, also in conventional sensors aimed at expansion of the dynamic range of the pixels by providing each unit pixel with a high-sensitivity photodiode and a low-sensitivity photodiode, the dynamic range cannot be further expanded, since it is not considered that the sensitivity of pixels varies according to colors.

BRIEF DESCRIPTION OF THE DRAWINGS

FIG. 1A, FIG. 1B, and FIG. 1C are cross-sectional views of a sensor in a solid-state imaging device according to a first embodiment.

FIG. 3A, FIG. 3B, and FIG. 3C are cross-sectional views of a sensor in a solid-state imaging device according to a second embodiment.

FIG. 9A and FIG. 9B are cross-sectional views of the sensor in the solid-state imaging device according to the second embodiment.

DETAILED DESCRIPTION

In general, according to one embodiment, a solid-state imaging device includes an imaging area, and color filters. The imaging area includes a plurality of arranged unit pixels. Each of the unit pixels includes a first photodiode, a first read transistor, a second photodiode, a second read transistor, a floating diffusion layer, a reset transistor, and an amplifying transistor. The first photodiode performs photoelectric conversion for incident light. The first read transistor is connected to the first photodiode and reads a signal charge obtained by the photoelectric conversion by the first photodiode. The second photodiode has a photosensitivity lower than a photosensitivity of the first photodiode, and performs photoelectric conversion for incident light. The second read transistor is connected to the second photodiode, and reads a signal charge obtained by the photoelectric conversion by the second photodiode. The floating diffusion layer is connected to the first and the second read transistors, and stores the signal charges. The reset transistor resets a potential of the floating diffusion layer. The amplifying transistor amplifies the potential of the floating diffusion layer.

The plurality of color filters include at least a first and a second color filters having different spectrum transmission characteristics. The relationship QSAT1>QSAT2 is satisfied when a saturation level of the second photodiode corresponding to the first color filter is denoted by QSAT1 and a saturation level of the second photodiode corresponding to the second color filter is denoted by QSAT2.

Figure 5:
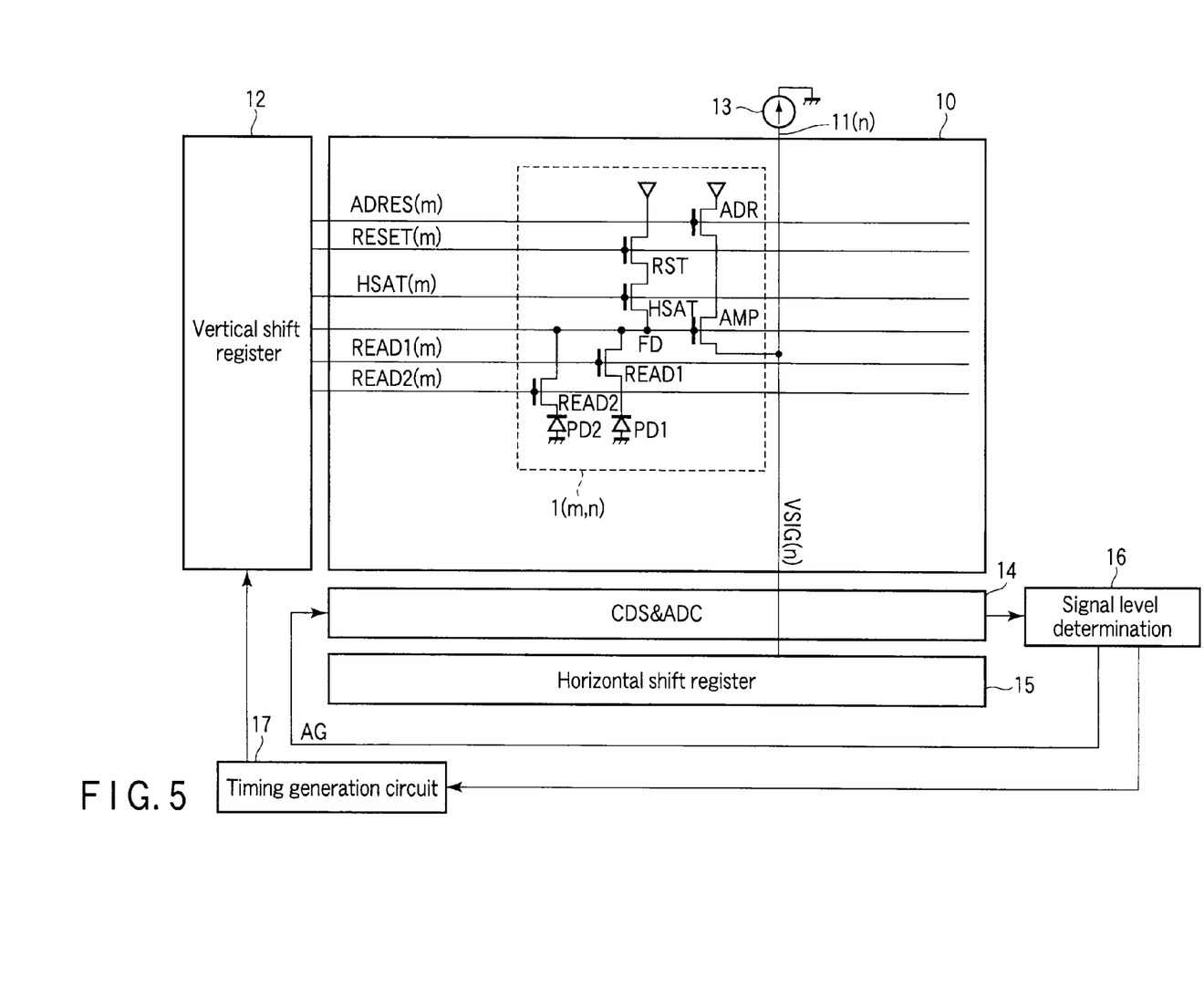
FIG. 5 is a block diagram schematically illustrating a CMOS image sensor according to a reference example.

First, before the first embodiment is explained, explained is a CMOS image sensor according to a reference example in which each unit pixel is provided with a high-sensitivity photodiode and a low-sensitivity photodiode. The sensor of the reference example is disclosed in the specification and drawings attached to the application of Jpn. Pat. Appln. No. 2009-157955, filed by the applicant of the present application. FIG. 5 is a block diagram schematically illustrating the sensor. An imaging area 10 includes a plurality of unit pixels (unit cells) 1 (m, n) which are arranged in m rows and n columns. FIG. 5 illustrates a unit pixel 1 (m, n) of row m and column n among the unit pixels, and a vertical signal line 11 (n) among vertical signal lines formed in a column direction and corresponding to respective columns of the imaging area, as representatives.

On one end side (the left side in FIG. 5) of the imaging area 10, a vertical shift register 12 which supplies pixel drive signals, such as ADRES (m), RESET (m), READ1 (m), and READ2 (m), to the rows of the imaging area is disposed.

On an upper end side (the upper side in FIG. 5) of the imaging area 10, current sources 13 which is connected to vertical signal lines 11 (n) of the respective columns are arranged, and operate as part of a pixel source-follower circuit.

On a lower end side (the lower side in FIG. 5) of the imaging area, arranged are a CDS and ADC 14 including a correlated double sampling (CDS) circuit and an analog-to-digital converter (ADC) circuit, and a horizontal shift register 15, which are connected to the vertical signal lines 11(n) of the columns. The CDS and ADC 14 subjects an analog output of a pixel to CDS processing, and converts the analog output into a digital output.

A signal level determination circuit 16 determines whether an output signal VSIG (n) of a unit pixel is smaller or larger than a predetermined value, based on the level of the output signal digitalized by the CDS and ADC 14, supplies a determination output to a timing generation circuit 17, and supplies the determination output to the CDS and ADC 14 as an analog gain (AG) control signal.

The timing generation circuit 17 generates an electronic shutter control signal which controls an accumulation time of the photodiode and a control signal for switching the operation mode at respective predetermined timings, and supplies the signals to the vertical shift register 12.

Each unit pixel has the same circuit configuration. Each unit pixel is provided with two photodiodes, that is, a high-sensitivity photodiode and a low-sensitivity photodiode. The structure of a unit pixel 1 (m, n) illustrated in FIG. 5 will now be explained below.

The unit pixel 1 (m, n) includes a first photodiode PD1, a first read transistor READ1, a second photodiode PD2, a second read transistor READ2, a floating diffusion layer FD, an amplifying transistor AMP, a reset transistor RST, and a selection transistor ADR. The first photodiode PD1 performs photoelectric conversion for incident light and accumulates the converted signal charge. The first read transistor READ1 is connected to the first photodiode PD1 and reads and controls the signal charge of the first photodiode PD1. The second photodiode PD2 has a photosensitivity lower than that of the first photodiode PD1, performs photoelectric conversion for incident light and accumulates the converted signal charge. The second read transistor READ2 is connected to the second photodiode PD2 and reads and controls the signal charge of the second photodiode PD2. The floating diffusion layer FD is connected to one ends of the first and the second read transistors READ1 and READ2, and temporarily stores the signal charges read by the first and the second read transistors READ1 and READ2. The amplifying transistor AMP has a gate connected to the floating diffusion layer FD, and amplifies a signal of the floating diffusion layer FD and outputs the amplified signal to the vertical signal line 11 (n). The reset transistor RST has a source connected to a gate potential (FD potential) of the amplifying transistor AMP, and resets the gate potential. The selection transistor ADR supplies and controls a power supply voltage to the amplifying transistor AMP to select and control a unit pixel of a desired horizontal position in the vertical direction. Each of the transistors is formed of an n-type MOSFET.

The selection transistors ADR, the reset transistor RST, the first read transistor READ1, and the second read transistor READ2 are driven by pixel drive signals ADRES (m), RESET (m), READ1 (m), READ2 (m), and HSAT (m), respectively, in signal lines of the corresponding row. In addition, one end of the amplifying transistor AMP is connected to the vertical signal line 11 (n) of the corresponding column.

Figure 6A:
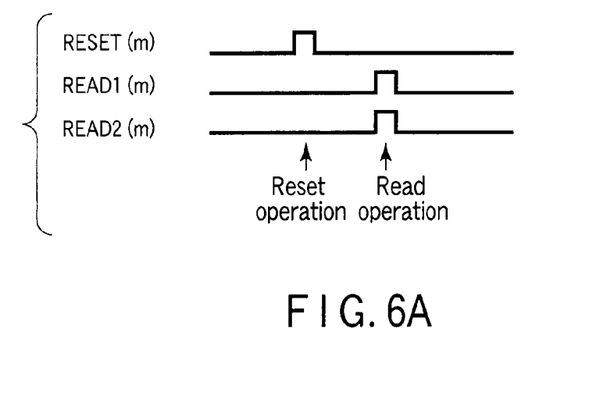
FIG. 6A is a timing chart illustrating operation timing of pixels in a high-sensitivity mode of the CMOS image sensor illustrated in FIG. 5.
Figure 6B:
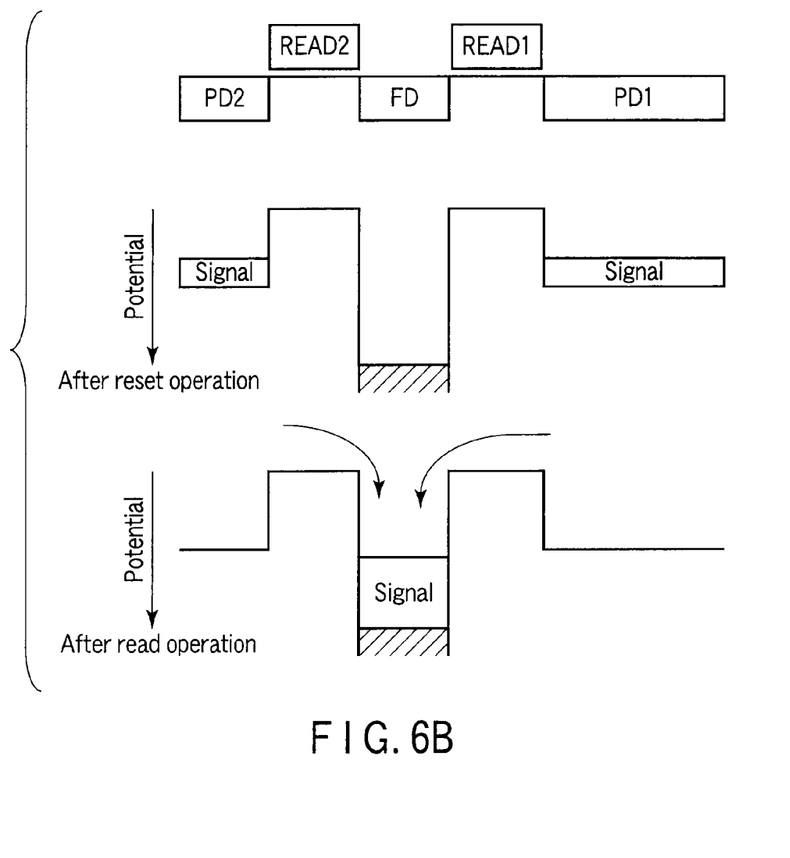
FIG. 6B is a diagram illustrating an example of a potential in a semiconductor substrate in reset operation and a potential in a read operation.

FIG. 6 is a diagram illustrating an example of operation timing of a pixel, a potential in the semiconductor substrate in reset operation and a potential in a read operation, in a high-sensitivity mode which is suitable for the case where a signal charge quantity accumulated in the floating diffusion layer FD is small (dark time), in the CMOS image sensor of FIG. 5. When the signal charge quantity of the floating diffusion layer FD is small, it is required to increase the sensitivity of the CMOS image sensor to improve the S/N ratio.

First, the reset transistor RST is turned on and performs reset operation, and thereby the potential of the floating diffusion layer FD directly after the reset operation is set to the same potential level as the power source of the pixel. After the reset operation is ended, the reset transistor RST is turned off. Thereby, a voltage set in accordance with the potential of the floating diffusion layer FD is output to the vertical signal line 11. The voltage magnitude is taken into the CDS circuit in the CDS and ADC 14 (dark time level).

Next, the first and the second read transistors READ1 and READ2 are turned on, and transmit signal charges which are accumulated in the first and the second photodiodes PD1 and PD2 up to that time to the floating diffusion layer FD. In the high-sensitivity mode, both of the first and the second read transistors READ1 and READ2 are turned on, and perform a read operation to transmit all the signal charges obtained in a dark state to the floating diffusion layer FD. With transmission of the signal charges, the potential of the floating diffusion layer is changed. Since a voltage determined in accordance with the potential of the floating diffusion layer FD is output to the vertical signal line 11, the voltage magnitude is taken into the CDS circuit (signal level). Thereafter, by subtracting the dark time level from the signal level, noise caused by variations of the threshold voltage of the amplifying transistor AMP is canceled, and only a pure signal component is taken out (CDS operation).

Although the first and the second read transistors READ1 and READ2 may be simultaneously turned on, the following operation is also possible. Specifically, after only the first read transistor READ1 is turned on and transmits a signal charge accumulated in the first photodiode PD1, the first read transistor READ1 is once turned off. Thereafter, only the second read transistor READ2 is turned on, and transmits a signal charge accumulated in the second photodiode PD2.

Generally, by turning on the read transistors, the potential of the floating diffusion layer FD is increased by capacity combination. However, according to the latter operation, since the two read transistors are not simultaneously turned on, increase in the potential of the floating diffusion layer FD is small. Therefore, it is possible to suppress generation of an electric-field-dependent dark current in the floating diffusion layer FD.

Figure 7A:
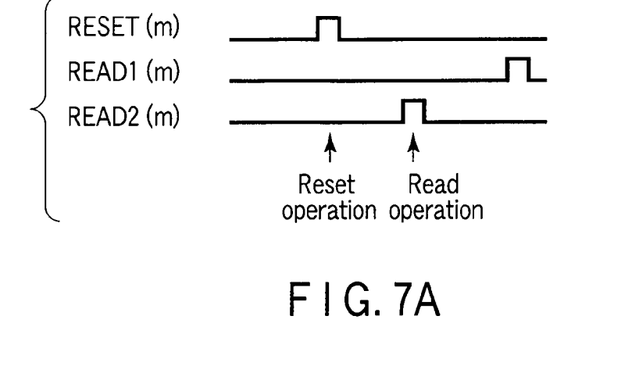
FIG. 7A is a timing chart illustrating operation timing of pixels in a low-sensitivity mode of the CMOS image sensor illustrated in FIG. 5.
Figure 7B:
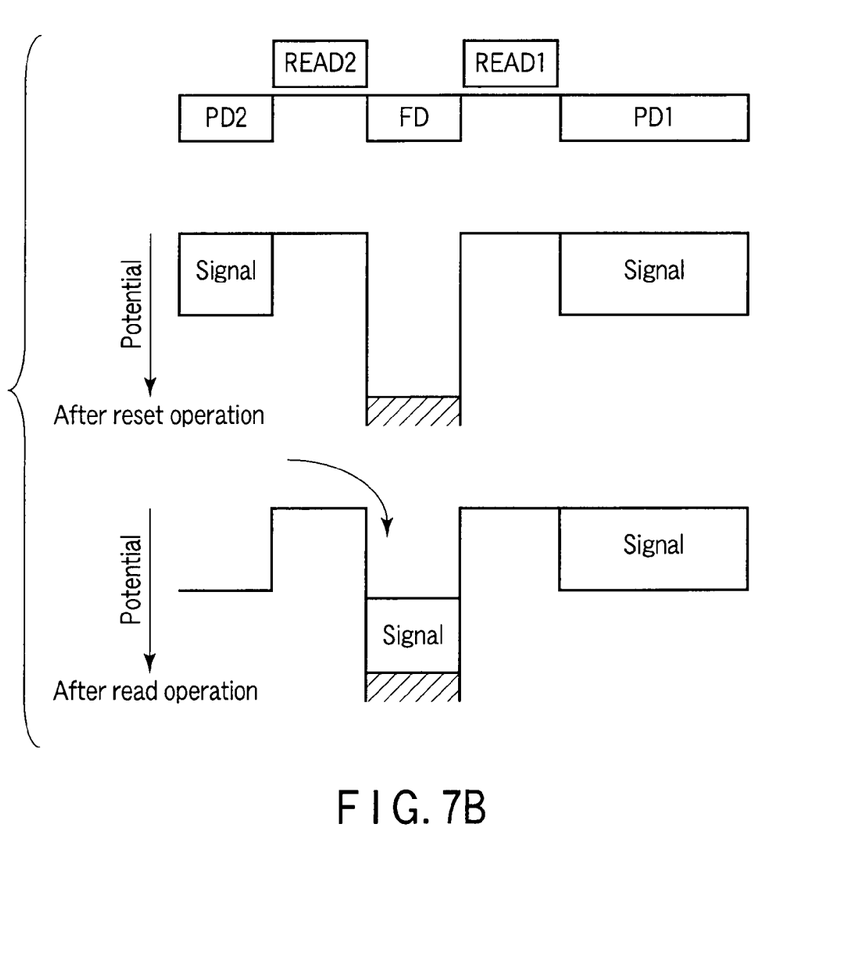
FIG. 7B is a diagram illustrating an example of a potential in the semiconductor substrate in reset operation and a potential in a read operation.

On the other hand, FIG. 7 is a diagram illustrating an example of operation timing of a pixel, a potential in the semiconductor substrate in reset operation and a potential in a read operation, in a low-sensitivity mode which is suitable for the case where a signal charge quantity accumulated in the first and the second photodiodes PD1 and PD2 is large (light time), in the CMOS image sensor of FIG. 5. When the signal charge quantity is large, it is required to decrease the sensitivity of the sensor to prevent saturation of the sensor as much as possible, and increase the dynamic range.

First, the reset transistor RST is turned on and performs reset operation, and thereby the potential of the floating diffusion layer FD directly after the reset operation is set to the same potential level as the power source of the pixel. After the reset operation is ended, the reset transistor RST is turned off. Thereby, a voltage determined in accordance with the potential of the floating diffusion layer FD is output to the vertical signal line 11. The voltage magnitude is taken into the CDS circuit in the CDS and ADC 14 (light time level).

Next, in the low-sensitivity mode, only the second read transistor READ2 is turned on, and performs a read operation to transmit only the signal charge accumulated in the second photodiode PD2 having the lower sensitivity to the floating diffusion layer FD. With transmission of the signal charge, the potential of the floating diffusion layer is changed. Since a voltage determined in accordance with the potential of the floating diffusion layer FD is output to the vertical signal line 11, the voltage magnitude is taken into the CDS circuit (signal level). Thereafter, by subtracting the light time level from the signal level, noise caused by variations of the threshold voltage of the amplifying transistor AMP is canceled, and only a pure signal component is taken out (CDS operation).

In the low-sensitivity mode, to prevent the signal charge of the first photodiode PD1 from overflowing into the floating diffusion layer FD, it is desirable to turn on the first read transistor READ1 directly before reset operation of the floating diffusion layer FD, and discharge the signal charge accumulated in the first photodiode PD1. In addition, the first read transistor READ1 may always be turned on, except for the period in which the floating diffusion layer FD is reset and the period in which a signal is read from the second photodiode PD2.

As described above, according to the CMOS image sensor of the reference example, each unit pixel is provided with two photodiodes, that is, a high-sensitivity photodiode and a low-sensitivity photodiode, and both the signals of the two photodiodes are used when a signal charge quantity is small. In such a case, signal charges are added in the unit pixel and read. In addition, when a signal charge quantity is large, only the signal of the low-sensitivity photodiode is read. As described above, two operation modes are used for different situations.

Figure 8:
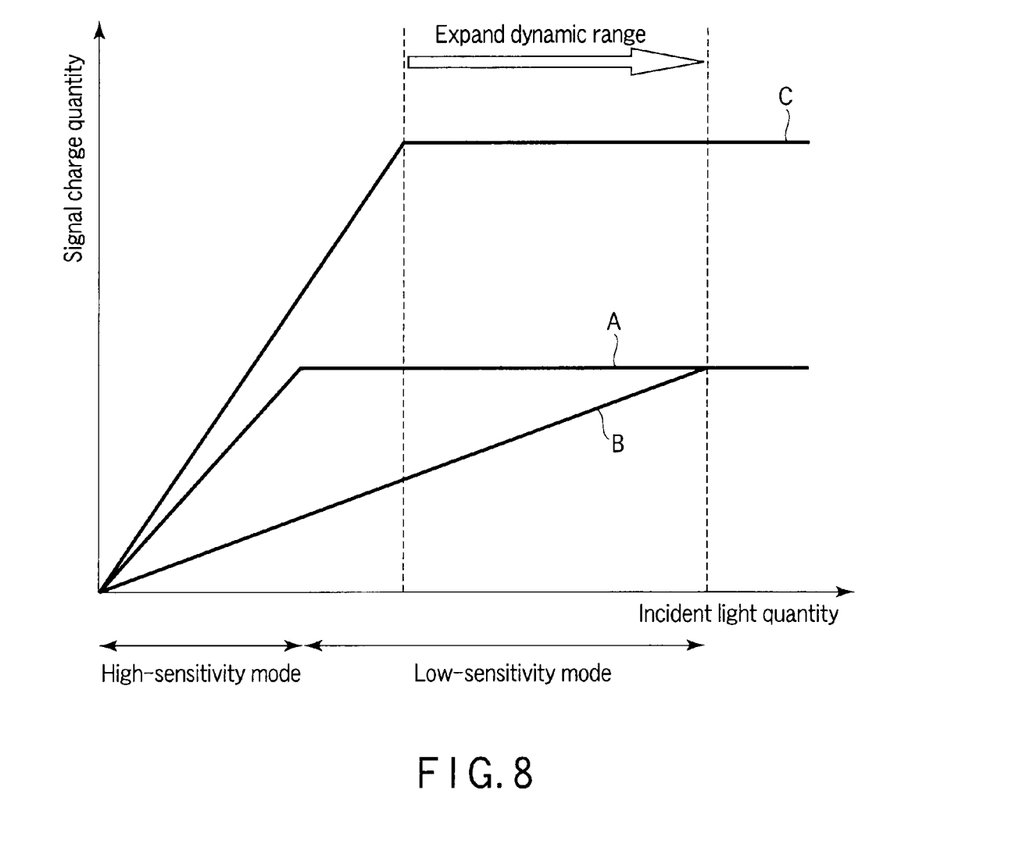
FIG. 8 is a diagram illustrating an example of characteristics for explaining a dynamic range expansion effect in the CMOS image sensor of the reference example.

FIG. 8 is a diagram illustrating an example of characteristics for explaining a dynamic range expansion effect in the CMOS image sensor of the reference example. In FIG. 8, the horizontal axis indicates an incident light quantity, and the vertical axis indicates a signal charge quantity generated in the photodiode. In FIG. 8, A denotes a characteristic of the high-sensitivity photodiode PD1, B denotes a characteristic of the low-sensitivity photodiode PD2, and C denotes a characteristic of a photodiode in the case where a unit pixel is provided with one photodiode (hereinafter referred to as a "normal pixel").

In this example, the photosensitivity of the high-sensitivity photodiode PD1 is set to ¾ the photosensitivity of the normal pixel, and the photosensitivity of the low-sensitivity photodiode PD2 is set to ¼ the photosensitivity of the normal pixel. In addition, both the saturation levels of the high- and low-sensitivity photodiodes PD1 and PD2 are set to ½ the saturation level of the normal pixel.

As is clear from FIG. 8, the signal charge quantity in the high-sensitivity mode, in which outputs of both the photodiodes PD1 and PD2 are added, is equal to the signal charge quantity of the normal pixel, since the photosensitivity of the high-sensitivity photodiode PD1 is set to ¾ the photosensitivity of the normal pixel and the photosensitivity of the low-sensitivity photodiode PD2 is set to ¼ the photosensitivity of the normal pixel.

Figures 9A, 9B:
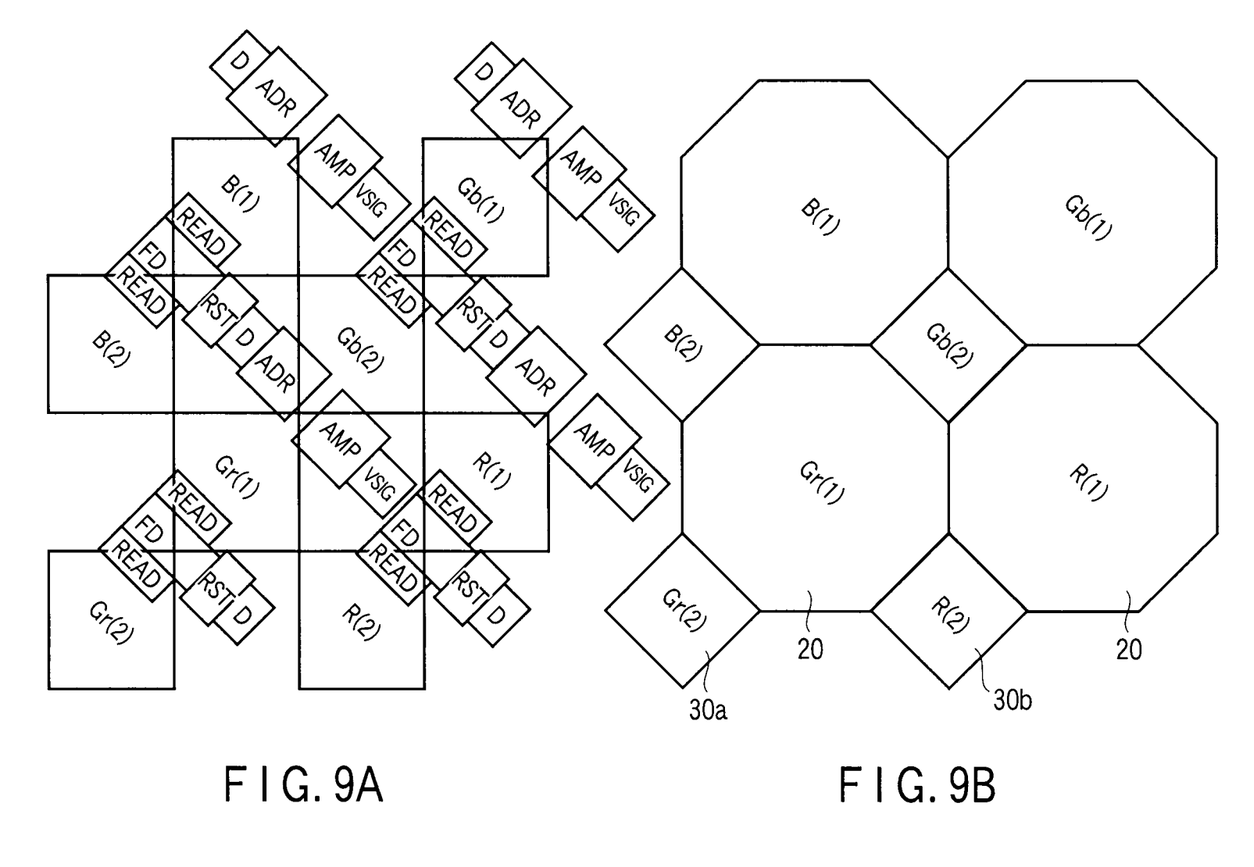
FIG. 9A is a schematic diagram illustrating a layout of device formation areas and gates, which is obtained by taking out a part of an imaging area of the CMOS image sensor illustrated in FIG. 5.
FIG. 9B is a schematic diagram illustrating a layout of color filters and microlenses, which is obtained by taking out a part of the imaging area of the CMOS image sensor illustrated in FIG. 5.

FIG. 9A is a diagram schematically illustrating a layout of device formation areas and gates, which is obtained by taking out a part of an imaging area of the CMOS image sensor illustrated in FIG. 5. FIG. 9B is a diagram schematically illustrating a layout of color filters and microlenses, which is obtained by taking out a part of the imaging area in the CMOS image sensor illustrated in FIG. 5. An ordinary RGB Bayer arrangement is adopted as the arrangement of the color filters.

In FIGS. 9A and 9B, reference symbols R(1) and R(2) denote areas corresponding to pixels for R, B(1) and B(2) denote areas corresponding to pixels for B, and Gb(1), Gb(2), Gr(1) and Gr(2) denote areas corresponding to pixels for G. Reference symbol D denotes a drain area connected to a power supply node of the pixel. Both the first and the second read transistors are denoted by reference symbol READ.

As illustrated in FIGS. 9A and 9B, each unit pixel is provided with a high-sensitivity photodiode and a low-sensitivity photodiode, a color filter and microlens 20 having a large area are disposed on the high-sensitivity photodiode, and a color filter and microlens 30 having a small area are disposed on the low-sensitivity photodiode. On the other hand, all the photodiodes have the same area, regardless of the photosensitivity and colors (G, B and R).

As is clear from FIG. 8, since the low-sensitivity photodiode PD2 has the saturation level which is ½ the saturation of the normal pixel and the photosensitivity which is ¼ the photosensitivity of the normal pixel, a range in which the low-sensitivity photodiode PD2 operates without saturation is consequently expanded to twice that of the normal pixel. Specifically, in the low-sensitivity mode in which only the output of the low-sensitivity photodiode PD2 is used, the dynamic range is expanded to twice that of the normal pixel.

However, when a color sensor is formed by using color filters, the dynamic range of pixels depends on the saturation level of photodiodes of pixels of a specific color, and pixels of the other colors cannot be used to the saturation level.

Specifically, in the sensor of FIG. 5, the sensitivity of G pixels is the highest, and G pixels reach the saturation level first when light is made incident. At this point in time, B and R pixels other than G pixels have not reached the saturation level. Generally, when a white subject is imaged, B pixels often have the lowest output. For example, FIG. 4 of Yoshitaka Egawa et al. "A 1/2.5 inch 5.2 Mpixel, 96 db Dynamic Range CMOS Image Sensor with Fixed Pattern Noise Free, Double Exposure Time Read Operation" 2006, IEEE International Solid-State Conference, Digest of Technical Papers 2006, pp. 135-138 discloses that the output of G pixels is the highest, the output of R pixels is the second highest, and the output of B pixels is the lowest, when a certain subject is imaged.

Supposing that the saturation level of pixels is fixed regardless of colors, the above case means that G pixels are saturated first, R pixels are saturated next, and B pixels are saturated last. Therefore, in the case where the sensor of FIG. 5 is used for a digital camera or the like, when G pixels are saturated, pixels of the other colors cannot perform photoelectric conversion any more, although they are not saturated. As a result, the dynamic range of the sensor is determined by the saturation of photodiodes of pixels of a specific color, specifically, G pixels, and the dynamic range cannot be further expanded.

Next, a solid-state imaging apparatus which can further expand the dynamic range of pixels will now be explained in a first embodiment.

<First Embodiment>

A CMOS image sensor of the first embodiment has a circuit configuration similar to the block diagram of FIG. 5. Specifically, the sensor of the first embodiment includes an imaging area 10 including a plurality of unit pixels (unit cells) 1 (m, n) which are arranged in m rows and n columns, vertical signal lines 11 (n), a vertical shift register 12, current sources 13, a CDS and ADC 14, a horizontal shift register 15, a signal level determination circuit 16, and a timing generation circuit 17.

In addition, like the unit pixel 1 (m, n) illustrated in FIG. 5, each unit pixel in the imaging area 10 is provided with: a first photodiode PD1, a first read transistor READ1, a second photodiode PD2, a second read transistor READ2, a floating diffusion layer FD, an amplifying transistor AMP, and a reset transistor RST. The first photodiode PD1 performs photoelectric conversion for incident light and accumulates the converted signal charge. The first read transistor READ1 is connected to the first photodiode PD1 and reads and controls the signal charge of the first photodiode PD1. The second photodiode PD2 has a photosensitivity lower than that of the first photodiode PD1, performs photoelectric conversion for incident light and accumulates the converted signal charge. The second read transistor READ2 is connected to the second photodiode PD2 and reads and controls the signal charge of the second photodiode PD2. The floating diffusion layer FD is connected to one ends of the first and the second read transistors READ1 and READ2, and temporarily stores the signal charges read by the first and the second read transistors READ1 and READ2. The amplifying transistor AMP has a gate connected to the floating diffusion layer FD, amplifies a signal of the floating diffusion layer FD and outputs the amplified signal to the vertical signal line 11 (n). The reset transistor RST has a source connected to a gate potential (FD potential) of the amplifying transistor AMP, and resets the gate potential. The selection transistor ADR supplies and controls a power supply voltage to the amplifying transistor AMP to select and control a unit pixel of a desired horizontal position in the vertical direction.

Figure 1A:
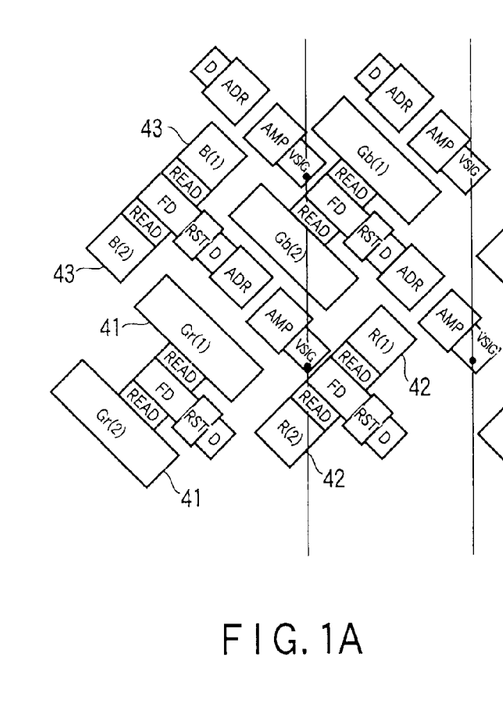
FIG. 1A is a schematic diagram illustrating a layout of device formation areas and gates, which is obtained by taking out a part of an imaging area of the sensor according to the first embodiment.
Figure 1B:
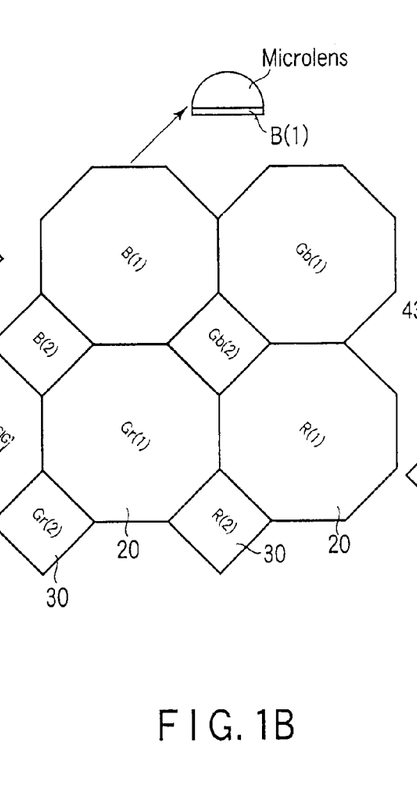
FIG. 1B is a schematic diagram illustrating a layout of color filters and microlenses, which is obtained by taking out a part of the imaging area of the sensor.
Figure 1C:
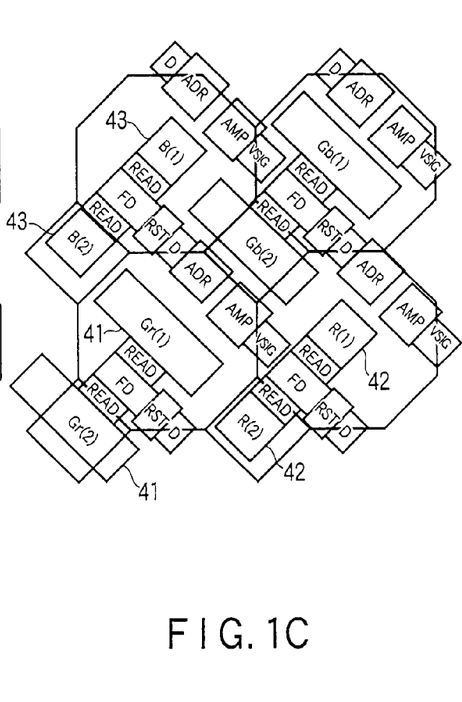
FIG. 1C is a schematic diagram illustrating a layout of the device formation areas and the gates and a layout of the color filters and the microlenses, which is obtained by taking out a part of the imaging area of the sensor.

FIG. 1A is a schematic diagram illustrating a layout of device formation areas and gates, which is obtained by taking out a part of an imaging area of the sensor according to the first embodiment. FIG. 1B is a schematic diagram illustrating a layout of color filters and microlenses, which is obtained by taking out a part of the imaging area of the sensor. FIG. 1C is a schematic diagram illustrating a layout of the device formation areas and the gates and a layout of the color filters and the microlenses of the sensor. An ordinary RGB Bayer arrangement is adopted as the arrangement of the color filters.

In FIGS. 1A to 10, reference symbols R(1) and R(2) denote areas corresponding to pixels for R, B(1) and B(2) denote areas corresponding to pixels for B, and Gb(1), Gb(2), Gr(1) and Gr(2) denote areas corresponding to pixels for G. Reference symbol D denotes a drain area connected to a power supply node of the pixel. In addition, vertical signal lines (11) are illustrated in FIG. 1A.

Like the sensor of the reference example, each unit pixel is provided with a high-sensitivity photodiode and a low-sensitivity photodiode, a color filter and microlens 20 having a large area are disposed on the high-sensitivity photodiode, and a color filter and microlens 30 having a small area are disposed on the low-sensitivity photodiode. Specifically, a color filter and microlens 20 having a spectrum transmission characteristic of R are disposed on the high- and low-sensitivity photodiodes PD1 and PD2 for R pixels, a color filter and microlens 20 having a spectrum transmission characteristic of B are disposed on the high- and low-sensitivity photodiodes PD1 and PD2 for B pixels, and a color filter and microlens 20 having a spectrum transmission characteristic of G are disposed on the high- and low-sensitivity photodiodes PD1 and PD2 for G pixels. The orientation of arranging the high- and low-sensitivity photodiodes PD1 and PD2 is inclined by 45° with respect to the extension direction of the vertical signal lines.

On the other hand, unlike the sensor of the reference example, the areas of the photodiodes are different according to colors of the pixels. Specifically, the high- and low-sensitivity photodiodes (PD1 and PD2) 41 for G pixels have large areas, and the high- and low-sensitivity photodiodes (PD1 and PD2) 42 and 43 for R and B pixels have small areas. The areas of the high- and low-sensitivity photodiodes PD1 and PD2 for G pixels are equal to each other, and the areas of the high- and low-sensitivity photodiodes PD1 and PD2 for R and B pixels are equal to each other. Generally, a saturation level of a pixel is proportional to the area of the photodiode. Therefore, the saturation level of the high- and low-sensitivity photodiodes PD1 and PD2 for G pixels is higher than the saturation levels of the high- and low-sensitivity photodiodes PD1 and PD2 for R and B pixels.

In the sensor of the first embodiment, the saturation level of pixels differs according to colors, and the saturation level of G pixels having a large output is set higher than the saturation levels of pixels of the other colors. Therefore, when images are taken, G pixels can be saturated almost simultaneously with R and B pixels.

Figure 2:
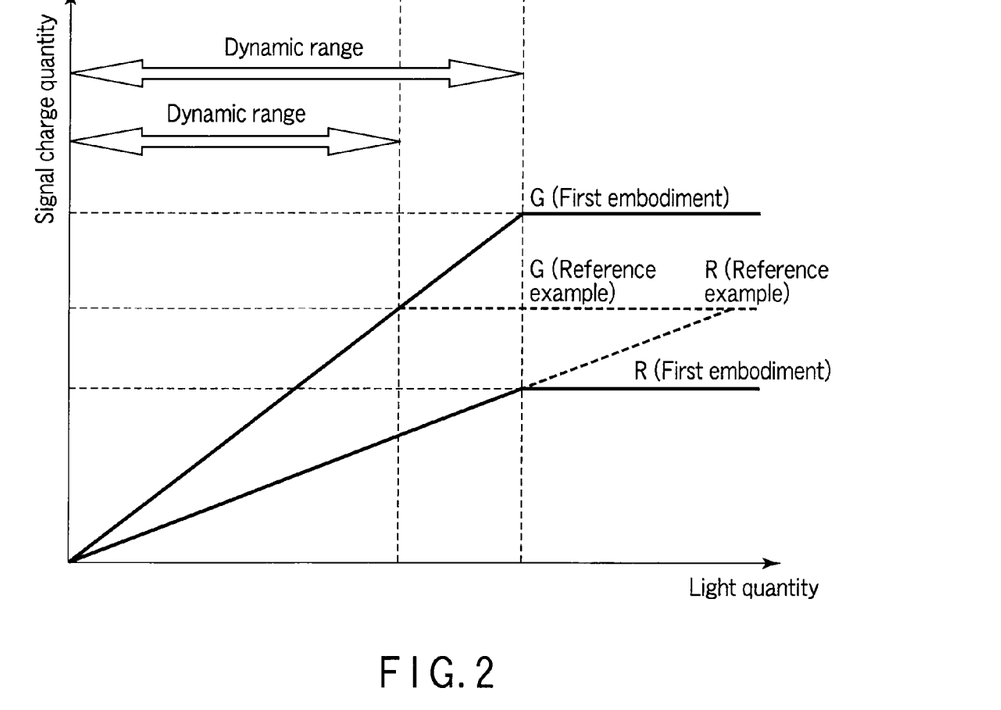
FIG. 2 is a diagram illustrating an example of characteristics of low-sensitivity photodiodes of the sensor of the first embodiment according to colors.

FIG. 2 is a diagram illustrating an example of characteristics of the low-sensitivity photodiodes PD2 according to colors in the sensor of the first embodiment. In FIG. 2, the horizontal axis indicates an incident light quantity, and the vertical axis indicates a signal charge quantity generated in the photodiode. Although the color filters have an RGB Bayer arrangement and there are pixels of three colors of R, G and B in the present embodiment, FIG. 2 only illustrates characteristics of the photodiodes PD2 of two colors, that is, G and R pixels, to aid understanding. In FIG. 2, the saturation level of G pixels is set to ¾ the saturation level of the G pixels of the reference example illustrated in FIG. 8, and the saturation level of R pixels is set to ⅔ the saturation level of the R pixels of the reference example illustrated in FIG. 8. As a result, the dynamic range of the pixels is increased to ¾ the dynamic range of the pixels of the reference example illustrated in FIG. 8.

Specifically, in the sensor of the present embodiment, when the saturation level of the low-sensitivity photodiodes PD2 corresponding to G color filters is denoted by QSAT1 and the saturation level of the low-sensitivity photodiodes PD2 corresponding to R and B color filters other than G is denoted by QSAT2, the dynamic range can be expanded when the following relation is satisfied.

QSAT1 >QSAT2

Since all the R, G, and B color filters of an RGB Bayer arrangement also have sensitivity for the near infrared area of 650 nm or more, near-infrared cut filters are used together. Therefore, the pixel output of each color in a sensor having color filters is greatly influenced by characteristics of the color filters and infrared cut filters. Typically, when the areas of photodiodes are set equal to each other among the colors, the ratio of pixel outputs is roughly R:G:B=1:3:1. Therefore, the area of the low-sensitivity photodiode (PD2) 41 corresponding to a G color filter should be set to three times as large as the area of each of low-sensitivity photodiodes (PD2) 42 and 43 corresponding to R and B color filters other than G.

<Second Embodiment>

A CMOS image sensor of a second embodiment has a circuit configuration similar to the block diagram of the CMOS image sensor of the reference example illustrated in FIG. 5. In addition, each unit pixel in an imaging area has a configuration similar to the unit pixel 1 (m, n) of the CMOS image sensor of the reference example illustrated in FIG. 5.

Figure 3A:
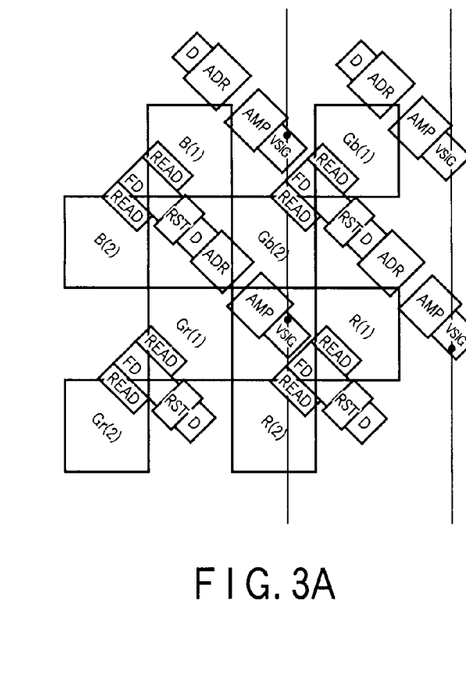
FIG. 3A is a schematic diagram illustrating a layout of device formation areas and gates, which is obtained by taking out a part of an imaging area of the sensor according to the second embodiment.
Figure 3B:
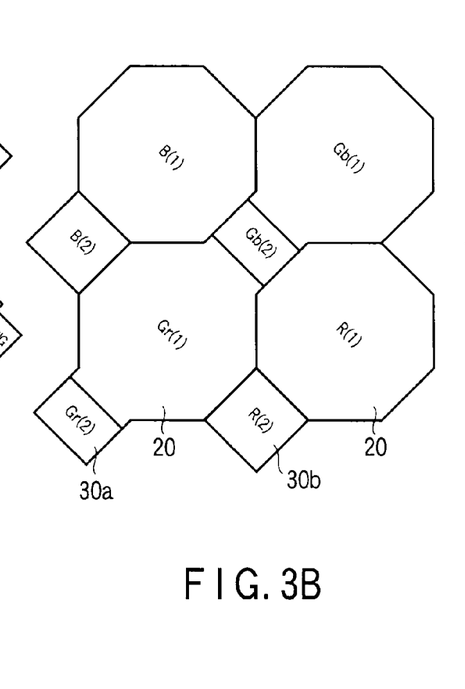
FIG. 3B is a schematic diagram illustrating a layout of color filters and microlenses, which is obtained by taking out a part of the imaging area of the sensor.
Figure 3C:
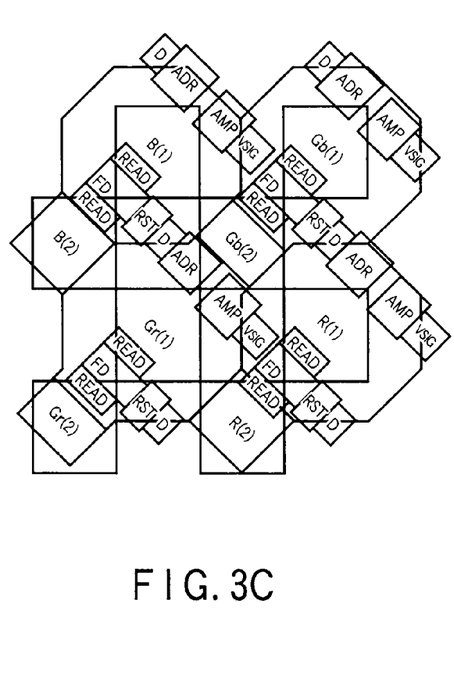
FIG. 3C is a schematic diagram illustrating a layout of the device formation areas and the gates and a layout of the color filters and the microlenses, which is obtained by taking out a part of the imaging area of the sensor.

FIG. 3A is a schematic diagram illustrating a layout of device formation areas and gates, which is obtained by taking out a part of an imaging area of the sensor according to the second embodiment. FIG. 3B is a schematic diagram illustrating a layout of color filters and microlenses, which is obtained by taking out a part of the imaging area of the sensor. FIG. 3C is a schematic diagram illustrating a layout of the device formation areas and the gates and a layout of the color filters and the microlenses. An ordinary RGB Bayer arrangement is adopted as the arrangement of color filters.

In FIGS. 3A to 3C, reference symbols R(1) and R(2) denote areas corresponding to pixels for R, B(1) and B(2) denote areas corresponding to pixels for B, and Gb(1), Gb(2), Gr(1) and Gr(2) denote areas corresponding to pixels for G. Reference symbol D denotes a drain area connected to a power supply node of the pixel. In addition, vertical signal lines (11) are illustrated in FIG. 1A.

Like the sensor of the reference example, each unit pixel is provided with a high-sensitivity photodiode and a low-sensitivity photodiode, a color filter and microlens 20 having a large area are disposed on the high-sensitivity photodiode, and a color filter and microlens 30 having a small area are disposed on the low-sensitivity photodiode. Specifically, color filters and microlenses 20 and 30a having a spectrum transmission characteristic of G is disposed on the high- and low-sensitivity photodiodes PD1 and PD2 for G pixels, color filters and microlenses 20 and 30b having a spectrum transmission characteristic of R is disposed on the high- and low-sensitivity photodiodes PD1 and PD2 for R pixels, and color filters and microlenses 20 and 30b having a spectrum transmission characteristic of B is disposed on the high- and low-sensitivity photodiodes PD1 and PD2 for B pixels. The orientation of arranging the high- and low-sensitivity photodiodes PD1 and PD2 is inclined by 45° with respect to the extension direction of the vertical signal lines.

On the other hand, unlike the sensor of the reference example, the areas of the photodiodes are different according to colors of the pixels. Specifically, as illustrated in FIG. 3, the area of the microlens (Gr(2)) of the color filter and microlens 30a on the low-sensitivity photodiode PD2 for G pixels is set small, and the area of the microlenses (R(2) and B(2)) of the color filters and microlenses 30b on the low-sensitivity photodiodes PD2 of R and B pixels is set large. The areas of the high- and low-sensitivity photodiodes PD1 and PD2 for G pixels are set equal to each other, and the areas of the high- and low-sensitivity photodiodes PD1 and PD2 of R and B pixels are set equal to each other.

As a result, when the same subject is imaged, the low-sensitivity photodiode PD2 of G pixels generates a signal charge quantity smaller than the low-sensitivity photodiode PD2 of G pixels of the reference example illustrated in FIG. 9, and does not easily reach the saturation level. Therefore, the timing of saturation of G pixels can be put closer to the timing of saturation of R and B pixels.

Figure 4:
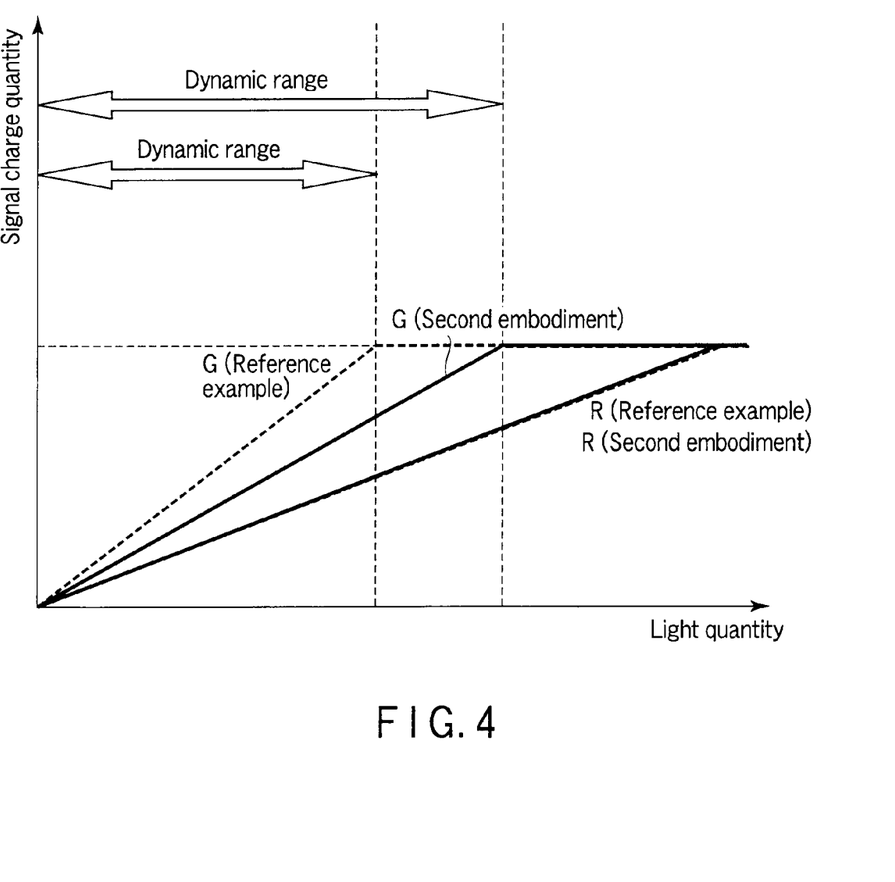
FIG. 4 is a diagram illustrating an example of characteristics of low-sensitivity photodiodes of the sensor of the second embodiment according to colors.

FIG. 4 is a diagram illustrating an example of characteristics of the low-sensitivity photodiodes PD2 according to colors in the sensor of the second embodiment. In FIG. 4, the horizontal axis indicates an incident light quantity, and the vertical axis indicates a signal charge quantity generated in the photodiode. Although the color filters have an RGB Bayer arrangement and there are pixels of three colors of R, G and B in the present embodiment, FIG. 4 only illustrates characteristics of the photodiodes PD2 of two colors, that is, G and R pixels, to aid understanding. Since the dynamic range of pixels is determined by G pixels and the timing of saturation of G pixels can be delayed, the dynamic range of the whole pixels is expanded more than the reference example of FIG. 9.

Specifically, in the sensor of the present embodiment, when the area of the microlens 30a which is provided for G color filters and collects light onto the low-sensitivity photodiode PD2 is denoted by AREA1, and the area of the microlens 30b which is provided for R and B color filters other than G and collects light onto the low-sensitivity photodiode PD2 is denoted by AREA 2, the dynamic range can be expanded when the following relation is satisfied.

AREA1 <AREA2

With respect to pixel outputs of colors in the sensor having R, G and B color filters, when the areas of photodiodes are set equal to each other among the colors, the ratio of pixel outputs is roughly R:G:B=1:3:1. Therefore, the area of the microlens 30a which is provided for G color filters and collects light onto the low-sensitivity photodiode PD2 should be set to ⅓ as large as the area of the microlens 30b which is provided for R and B color filters other than G and collects light onto the low-sensitivity photodiode PD2.

Although the above embodiments show an example of a solid-state imaging device having pixels of three colors, that is, R, G and B, and using color filters of an RGB Bayer arrangement as color filters for obtaining color information, it is also possible to use color filters of four colors, that is, W (transparent), B (blue), G (green), and R (red), in a solid-state imaging device having pixels of four colors, that is, W, R, G and B. In such a case, since the photosensitivity of W (transparent) pixels is the highest, the area of microlenses corresponding to W (transparent) should be increased, or the area of photodiodes corresponding to W (transparent) should be increased.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A solid-state imaging device comprising:
    an imaging area which includes pixels of three colors of R, G and B, each of pixels including:
        a first photodiode which performs photoelectric conversion for incident light;
        a first read transistor which is connected to the first photodiode and reads a signal charge obtained by the photoelectric conversion by the first photodiode;
        a second photodiode which has a photosensitivity lower than a photosensitivity of the first photodiode, and performs photoelectric conversion for the incident light;

a second read transistor which is connected to the second photodiode, and reads a signal charge obtained by the photoelectric conversion by the second photodiode;

a floating diffusion layer which is provided between the first photodiode and the second photodiode, is connected to the first and the second read transistors, and stores the signal charges;

a reset transistor which is provided to contact the floating diffusion layer in a direction perpendicular to a direction in which the first and the second photodiodes are arranged and which resets a potential of the floating diffusion layer; and an amplifying transistor which is provided to contact the floating diffusion layer in a direction perpendicular to a direction in which the first and the second photodiodes are arranged and which amplifies the potential of the floating diffusion layer; and a plurality of color filters which include color filters for R, G and B, color filter for R and B and color filter for G having different spectrum transmission characteristics, wherein the relationship QSAT1 > QSAT2 is satisfied, where QSAT1 represents a saturation level of the second photodiode corresponding to the color filter for G, and a QSAT2 represents saturation level of the second photodiode corresponding to the color filter for R and B and, an area of the second photodiode corresponding to G is larger than an area of the second photodiode corresponding to R and B.

2. The device according to claim 1, further comprising: a vertical signal line, and wherein an orientation in which the first photodiode and the second photodiode is arranged is inclined by angle of 45 degree with respect to the vertical signal line.

3. The device according to claim 1, wherein the solid-state imaging device includes pixels of three colors of R, G and B, the color filter for G has a spectrum transmission characteristic of G, and the color filter for R and B has a spectrum transmission characteristic of colors other than G.

4. The device according to claim 1, wherein the solid-state imaging device includes pixels of four colors of W, R, G and B, a first color filter for W has a spectrum transmission characteristic of W, and a second color for R B and G filter has a spectrum transmission characteristic of colors other than W.

5. The device according to claim 1, wherein a saturation level of the second photodiode corresponding to the color filter for G is equal to the saturation level of the second photodiode corresponding to the color filter for R and B.

6. The device according to claim 1, wherein the first photodiode includes a diffusion layer of a second conduction type which is formed in a surface of a semiconductor area of a first conduction type, and an area occupied by the diffusion layer of the first photodiode corresponding to the color filter for G is larger than an area occupied by the diffusion layer of the first photodiode corresponding to the color filter for R and B.

7. The device according to claim 1, wherein the first photodiode includes a diffusion layer of a second conduction type which is formed in a surface of a semiconductor area of a first conduction type, and an area occupied by the diffusion layer of the first photodiode corresponding to the color filter for R is equal to an area occupied by the diffusion layer of the first photodiode corresponding to the color filter for B.

8. The device according to claim 1, wherein the first photodiode includes a first diffusion layer of a second conduction type which is formed in a surface of a semiconductor area of a first conduction type, the second photodiode includes a second diffusion layer of the second conduction type which is formed in a surface of a semiconductor area of the first conduction type, and areas occupied by the first and the second diffusion layers of the first and the second photodiodes are equal to each other.

9. The device according to claim 1, wherein the color filter for G has a spectrum transmission characteristic of green light, and the color filter for R and B has a spectrum transmission characteristic of blue light or red light.

* * * * *